(12) United States Patent
Jiang

(10) Patent No.: US 10,050,626 B2
(45) Date of Patent: Aug. 14, 2018

(54) CMOS INVERTER AND ELECTRONIC DEVICE USING THE CMOS INVERTER

(71) Applicant: Shenzhen China Star Optoelectronics Technology Co., Ltd., Shenzhen, Guangdong (CN)

(72) Inventor: Zhixiong Jiang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 133 days.

(21) Appl. No.: 15/308,586

(22) PCT Filed: Aug. 31, 2016

(86) PCT No.: PCT/CN2016/097528
§ 371 (c)(1),
(2) Date: Nov. 2, 2016

(87) PCT Pub. No.: WO2018/032538
PCT Pub. Date: Feb. 22, 2018

(65) Prior Publication Data
US 2018/0191350 A1 Jul. 5, 2018

(30) Foreign Application Priority Data
Aug. 16, 2016 (CN) .......................... 2016 1 0671927

(51) Int. Cl.
*H03K 19/0948* (2006.01)
*H03K 19/20* (2006.01)

(52) U.S. Cl.
CPC ......... *H03K 19/0948* (2013.01); *H03K 19/20* (2013.01)

(58) Field of Classification Search
None
See application file for complete search history.

(56) References Cited

U.S. PATENT DOCUMENTS

| 6,218,867 B1 * | 4/2001 | Imai ................... H03K 19/1737 326/113 |
| 7,212,062 B2 * | 5/2007 | Sperling .............. H03K 17/162 326/105 |
| 7,342,423 B2 * | 3/2008 | Degrendel .............. G06F 21/70 326/112 |

(Continued)

*Primary Examiner* — Minh D A
*Assistant Examiner* — James H Cho
(74) *Attorney, Agent, or Firm* — Andrew C. Cheng

(57) ABSTRACT

Disclosed is a CMOS inverter, including a first selector, a second selector, and a first transistor, a second transistor, a third transistor and a fourth transistor, which respectively are coupled to the input end of the CMOS inverter through the gates, and all the first transistor, the second transistor, the third transistor and the fourth transistor are coupled to the output end of the CMOS inverter, and sources of the first, the third transistors are respectively and correspondingly coupled to a first output end and a second output end of the first selector, and sources of the second, the fourth transistors are respectively and correspondingly coupled to a first output end and a second output end of the second selector; both the first selector and the second selector receive a first control signal and a second control signal, and both are coupled to the input end.

20 Claims, 3 Drawing Sheets

(56) References Cited

U.S. PATENT DOCUMENTS 8,111,089 B2 * 2/2012 Cocchi .................. H03K 19/20
326/113
2015/0109047 A1 * 4/2015 Ryu .................. H03K 19/0013
327/399

* cited by examiner

CMOS INVERTER AND ELECTRONIC DEVICE USING THE CMOS INVERTER

CROSS REFERENCE

This application claims the priority of Chinese Patent Application No. 201610671927.7, entitled "CMOS inverter and electronic device using the CMOS inverter", filed on Aug. 16, 2016, the disclosure of which is incorporated herein by reference in its entirety.

FIELD OF THE INVENTION

The present invention relates to a circuit technical field, and more particularly relates to a CMOS inverter and an electronic device using the CMOS inverter.

BACKGROUND OF THE INVENTION

The CMOS (Complementary Metal Oxide Semiconductor) inverter is an element which is commonly used in the circuit. The CMOS inverter receives an input signal and outputs an output signal which has a logic inversion with the input signal.

Please refer to FIG. 1. FIG. 1 is a circuit structure diagram of the CMOS inverter according to prior art. As shown in FIG. 1, the inverter comprises a P-channel Metal Oxide Semiconductors (PMOS) transistor T1 and a N-channel Metal Oxide Semiconductors (NMOS) transistor T2. However, the power source voltage Vdd of high voltage level and the power source voltage Vss of low voltage level which are received are constant and invariant that Vdd and Vss are respectively supposed to be 30V and −6V. As the input signal in of high voltage level is inputted, the NMOS transistor T2 is activated, and the inverter outputs the low voltage level −6V of Vss, and then the voltage Vds between the drain and the source of the PMOS transistor T1 is constantly kept to be the absolute value (36V) of the voltage difference of Vdd and Vss. Until the input signal in is changed to be low voltage level, the PMOS transistor T1 constantly suffers the stress voltage of 36V in this period of time. Similarly, as the input signal in starts from low voltage level, and until it changes to the high voltage level, the NMOS transistor T2 also similarly suffers the high stress voltage. As the voltage difference (i.e. the voltage Vds) of Vdd and Vss is larger, and the core transistor in the CMOS inverter is in the higher stress voltage condition in the long period of time, it easily leads to the aging and damage of the transistor, and thus to reduce the usage lifetime of the inverter.

SUMMARY OF THE INVENTION

The embodiment of the present invention provides a CMOS inverter and the application, which can reduce the stress period of the core transistor in the CMOS inverter that the output voltage difference is larger to reduce the transistor deterioration and to promote the usage lifetime of the CMOS inverter.

First, the embodiment of the present invention provides a Complementary Metal Oxide Semiconductor (CMOS) inverter, wherein the CMOS inverter comprises a first selector, a second selector, a first transistor, a second transistor, a third transistor and a fourth transistor, wherein:

all gates of the first transistor, the second transistor, the third transistor and the fourth transistor are coupled to an input end of the CMOS inverter, and all drains of the first transistor, the second transistor, the third transistor and the fourth transistor are coupled to an output end of the CMOS inverter, and a source of the first transistor is coupled to a first output end of the first selector, and a source of the third transistor is coupled to a second output end of the first selector, and a source of the second transistor is coupled to a first output end of the second selector, and a source of the fourth transistor is coupled to a second output end of the second selector;

both the first selector and the second selector receive a first control signal and a second control signal, and the first control signal and the second control signal are inverse in phase, and both the first selector and the second selector are electrically coupled to an input end of the CMOS inverter;

as the second control signal is high voltage level or the input end of the CMOS inverter is inputted with a high voltage level signal, the first output end of the first selector outputs the second control signal; as the first control signal is high voltage level or the input end of the CMOS inverter is inputted with the high voltage level signal, the second output end of the first selector outputs the first control signal; as the first control signal is low voltage level or the input end of the CMOS inverter is inputted with a low voltage level signal, the second output end of the second selector outputs the first control signal; as the second control signal is low voltage level or the input end of the CMOS inverter is inputted with the low voltage level signal, the first output end of the second selector outputs the second control signal.

The first selector comprises a first select circuit and a second select circuit, wherein:

both the first select circuit and the second select circuit receives the first control signal and the second control signal, and both the first select circuit and the second select circuit are electrically coupled to the input end of the CMOS inverter, and the first select circuit is electrically coupled to the source of the first transistor, and the second select circuit is electrically coupled to the source of the third transistor.

The second selector comprises a third select circuit and a fourth select circuit, wherein:

both the third select circuit and the fourth select circuit receives the first control signal and the second control signal, and both the third select circuit and the fourth select circuit are electrically coupled to the input end of the CMOS inverter, and the third select circuit is electrically coupled to the source of the second transistor, and the fourth select circuit is electrically coupled to the source of the fourth transistor.

The first select circuit comprises a fifth transistor and a sixth transistor, wherein:

a gate of the fifth transistor receives the first control signal, and a gate of the sixth transistor is coupled to the input end of the CMOS inverter, and both a source of the fifth transistor and a drain of the sixth transistor receives the second control signal, and both a drain of the fifth transistor and a source of the sixth transistor are electrically coupled to the first output end of the first selector.

The second select circuit comprises a seventh transistor and an eighth transistor, wherein:

a gate of the seventh transistor receives the second control signal, and a gate of the eighth transistor is coupled to the input end of the CMOS inverter, and both a source of the seventh transistor and a drain of the eighth transistor receives the first control signal, and both a drain of the seventh transistor and a source of the eighth transistor are electrically coupled to the second output end of the first selector.

The third select circuit comprises a ninth transistor and a tenth transistor, wherein:

a gate of the ninth transistor receives the first control signal, and a gate of the tenth transistor is coupled to the input end of the CMOS inverter, and both a source of the ninth transistor and a drain of the tenth transistor receives the second control signal, and both a drain of the ninth transistor and a source of the tenth transistor are electrically coupled to the first output end of the second selector.

The fourth select circuit comprises an eleventh transistor and a twelfth transistor, wherein:

a gate of the eleventh transistor receives the second control signal, and a gate of the twelfth transistor is coupled to the input end of the CMOS inverter, and both a source of the eleventh transistor and a drain of the twelfth transistor receives the first control signal, and both a drain of the eleventh transistor and a source of the twelfth transistor are electrically coupled to the second output end of the second selector.

Both the first transistor and the third transistor are PMOS (P-channel Metal Oxide Semiconductor) transistors, and both the second transistor and the fourth transistor are NMOS (N-channel Metal Oxide Semiconductor) transistors.

High voltage level duty ratio durations and low voltage level duty ratio durations of the first control signal and the second control signal in one cycle are equal.

Second, the embodiment of the present invention further provides an electronic device. The electronic device comprises the aforesaid CMOS inverter.

In the CMOS inverter provided by the embodiment of the present invention, as the second control signal is high voltage level, and the first control signal is low voltage level, the first output end of the first selector outputs the second control signal, and the second output end of the second selector outputs the first control signal; if the input end of the CMOS inverter is inputted with the high voltage level signal, the second output end of the first selector outputs the first control signal; the second transistor and the fourth transistor are activated, and a voltage difference between the source and the drain of the third transistor is zero, and a voltage difference between the source and the drain of the first transistor is larger; if the input end of the CMOS inverter is inputted with the low voltage level signal, the first output end of the second selector is selected to output the second control signal, and the first transistor and the third transistor are activated, and a voltage difference between the source and the drain of the second transistor is zero, and a voltage difference between the source and the drain of the fourth transistor is larger. As the first control signal is high voltage level and the second control signal is low voltage level, the second output end of the first selector outputs the first control signal, and the first output end of the second selector outputs the second control signal, and if the input end of the CMOS inverter is inputted with the high voltage level signal, the first output end of the first selector is selected to output the second control signal, and the voltage difference between the source and the drain of the first transistor is zero, and the voltage difference between the source and the drain of the third transistor is larger; if the input end of the CMOs inverter is inputted with the low voltage level signal, the second output end of the second selector is selected to output the first control signal; the voltage difference between the source and the drain of the fourth transistor is zero, and the voltage difference between the source and the drain of the first transistor is larger. Obviously, in the work procedure of the CMOS inverter, according to the voltage level high and low of the first, the second control signals, and the voltage level high and low of the inverter input end signals, in the same duration, only one transistor in the first transistor, the second transistor, the third transistor and the fourth transistor is in the stress state, which relatively reduces the stress period of each transistor. By practicing the CMOS inverter in the embodiment of the present invention, the issue of the transistor lifetime decrease because the core transistor is in the high voltage state for a long period of time in the circuit that the inverter output voltage different is larger can be solved.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

For better explaining the technical solution and the effect of the present invention, the present invention will be further described in detail with the accompanying drawings in the specific embodiments. It is clear that the described embodiments are part of embodiments of the present application, but not all embodiments. Based on the embodiments of the present invention, all other embodiments to those of ordinary skill in the premise of no creative efforts obtained, should be considered within the scope of protection of the present invention.

Besides, the following descriptions for the respective embodiments are specific embodiments capable of being implemented for illustrations of the present invention with referring to appended figures. For example, the terms of up, down, front, rear, left, right, interior, exterior, side, etceteras are merely directions of referring to appended figures. Therefore, the wordings of directions are employed for explaining and understanding the present invention but not limitations thereto.

In the description of the invention, which needs explanation is that the term "installation", "connected", "connection" should be broadly understood unless those are clearly defined and limited, otherwise, For example, those can be a fixed connection, a detachable connection, or an integral connection; those can be a mechanical connection, or an electrical connection; those can be a direct connection, or an indirect connection with an intermediary, which may be an internal connection of two elements. To those of ordinary skill in the art, the specific meaning of the above terminology in the present invention can be understood in the specific circumstances.

Besides, in the description of the present invention, unless with being indicated otherwise, "plurality" means two or more. In the present specification, the term "process" encompasses an independent process, as well as a process that cannot be clearly distinguished from another process but yet achieves the expected effect of the process of interest. Moreover, in the present specification, any numerical range expressed herein using "to" refers to a range including the numerical values before and after "to" as the minimum and maximum values, respectively. In figures, the same reference numbers will be used to refer to the same or like parts.

The embodiment of the present invention provides a CMOS inverter, which can reduce the stress period of the core transistor in the CMOS inverter to reduce the transistor deterioration and to promote the usage lifetime of the CMOS inverter. The detail descriptions are respectively introduced below.

Figure 1:
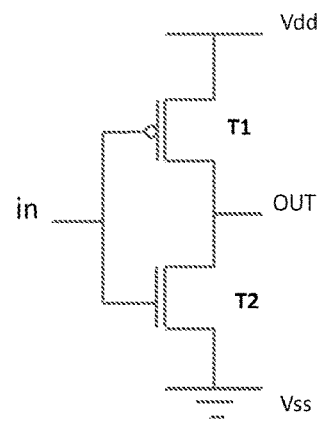
FIG. 1 is a circuit structure diagram of the CMOS inverter according to prior art.
Figure 2:
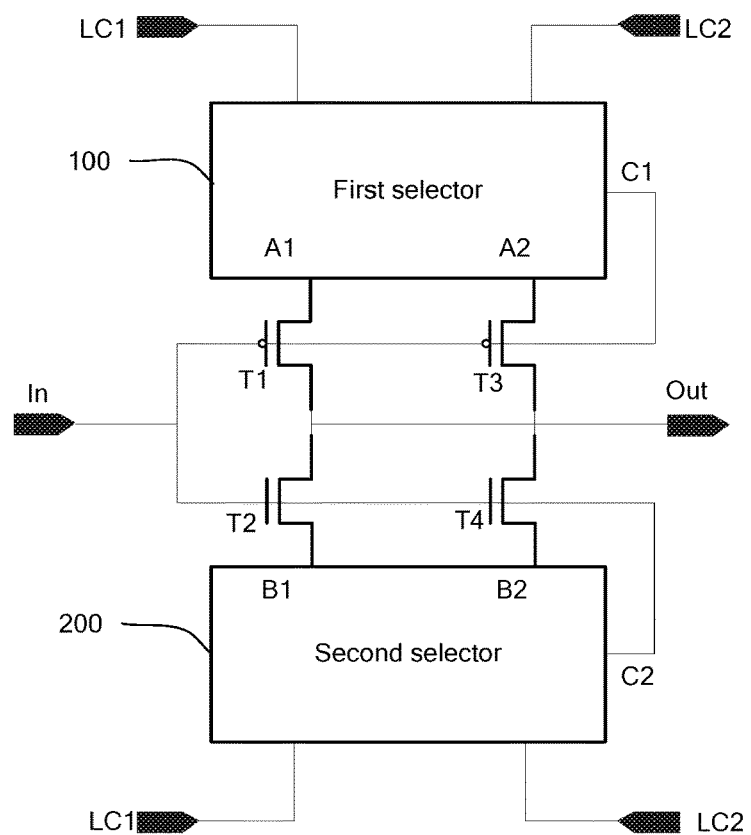
FIG. 2 is a circuit diagram of a CMOS inverter disclosed by the embodiment of the present invention.

Please refer to FIG. 2. FIG. 2 is a circuit diagram of a Complementary Metal Oxide Semiconductor (CMOS) inverter disclosed by the embodiment of the present invention.

In the embodiment, the CMOS inverter comprises a first selector 100, a second selector 200, a first transistor T1, a second transistor T2, a third transistor T3 and a fourth transistor T4, wherein: all gates of the first transistor T1, the second transistor T2, the third transistor T3 and the fourth transistor T4 are coupled to an input end In of the CMOS inverter; all drains of the first transistor T1, the second transistor T2, the third transistor T3 and the fourth transistor T4 are coupled to an output end Out of the CMOS inverter. Specifically, a drain of the first transistor T1 and a drain of the second transistor T2 are coupled and then coupled to the output end Out, and a drain of the third transistor T3 and a drain of the fourth transistor T4 are coupled and then coupled to the output end Out. A source of the first transistor T1 is coupled to a first output end A1 of the first selector 100, and a source of the third transistor T3 is coupled to a second output end A2 of the first selector 100, and a source of the second transistor T2 is coupled to a first output end B1 of the second selector 200, and a source of the fourth transistor T4 is coupled to a second output end B2 of the second selector 200. In the embodiment, both the first transistor T1 and the third transistor T3 are P-channel Metal Oxide Semiconductor transistors (PMOS transistors), and both the second transistor and the fourth transistor are N-channel Metal Oxide Semiconductor transistors (NMOS transistors).

Both the first selector 100 and the second selector 200 receive a first control signal LC1 and a second control signal LC2, and the first control signal LC1 and the second control signal LC2 are inverse in phase. Both the first selector 100 and the second selector 200 are electrically coupled to an input end In of the CMOS inverter. Specifically, the control end C1 of the first selector 100 is coupled to the input end In of the CMOS inverter through the gates of the first transistor T1 and the third transistor T3; the control end C2 of the second selector 200 is coupled to the input end In of the CMOS inverter through the gates of the second transistor T2 and the fourth transistor T4.

As the second control signal LC2 is high voltage level (i.e. as the first control signal LC1 is low voltage level) or the input end In of the CMOS inverter is inputted with a high voltage level signal (either of the aforesaid conditions is satisfied), the first output end A1 of the first selector 100 still outputs the second control signal LC2. Specifically, as the input end In of the CMOS inverter is inputted with the high voltage level signal, no matter the second control signal LC2 is high voltage level or low voltage level, the first output end A1 of the first selector 100 still outputs the second control signal LC2. As the second control signal LC2 is high voltage level, no matter the input end In of the CMOS inverter is inputted with the low voltage level signal, or the input end In is inputted with the high voltage level signal, the first output end A1 of the first selector 100 still outputs the second control signal LC2 of high voltage level.

As the first control signal LC1 is high voltage level (i.e. as the second control signal LC2 is low voltage level) or the input end In of the CMOS inverter is inputted with the high voltage level signal (either of the aforesaid conditions is satisfied), the second output end A2 of the first selector 100 still outputs the first control signal LC1. Specifically, as the input end In of the CMOS inverter is inputted with the high voltage level signal, no matter the first control signal LC1 is high voltage level or low voltage level, the second output end A2 of the first selector 100 still outputs the first control signal LC1. As the second control signal LC2 is high voltage level, no matter the input end In of the CMOS inverter is inputted with the low voltage level signal, or the input end In is inputted with the high voltage level signal, the first output end A1 of the first selector 100 still outputs the second control signal LC2 of high voltage level.

As the first control signal LC1 is low voltage level or the input end In of the CMOS inverter is inputted with the low voltage level signal (either of the aforesaid conditions is satisfied), the second output end B2 of the second selector 200 still outputs the first control signal LC1. Specifically, as the input end In of the CMOS inverter is inputted with the low voltage level signal, no matter the first control signal LC1 is low voltage level or high voltage level, the second output end B2 of the second selector 200 still outputs the first control signal LC1. As the first control signal LC1 is high voltage level, no matter the input end In of the CMOS inverter is inputted with the low voltage level signal, or the input end In is inputted with the high voltage level signal, the second output end B2 of the second selector 200 still outputs the second control signal LC2 of low voltage level.

As the second control signal LC2 is low voltage level or the input end In of the CMOS inverter is inputted with the low voltage level signal (either of the aforesaid conditions is satisfied), the first output end B1 of the second selector 200 still outputs the second control signal LC2. Specifically, as the input end In of the CMOS inverter is inputted with the low voltage level signal, no matter the second control signal LC2 is low voltage level or high voltage level, the first output end B1 of the second selector 200 still outputs the second control signal LC2. As the second control signal LC2 is low voltage level, no matter the input end In of the CMOS inverter is inputted with the low voltage level signal, or the input end In is inputted with the high voltage level signal, the second output end B2 of the second selector 200 still outputs the second control signal LC2 of low voltage level.

In the CMOS inverter structure described in FIG. 2, as the second control signal LC2 is high voltage level or the first control signal LC1 is low voltage level, the first output end A1 of the first selector 100 outputs the second control signal LC2, and the second output end B2 of the second selector 200 outputs the first control signal LC1; if the input end In of the CMOS inverter is inputted with the high voltage level signal, the second output end A2 of the first selector 100 outputs the first control signal LC1, and because the input end In is the high voltage level signal, the second transistor T2 and the fourth transistor T4 are activated, the output end Out of the CMOS inverter outputs the first control signal LC1 of low voltage level, and then the voltage difference between the source and the drain of the third transistor T3 is zero, and the voltage difference between the source and the drain of the first transistor T1 is larger, which is equal to the absolute value of the voltage level difference of the first control signal LC1 and the second control signal LC2, i.e. only the first transistor T1 is in the high voltage stress state. If the input end In of the CMOS inverter is inputted with the low voltage level signal, the first output end B1 of the second selector 200 is selected to output the second control signal LC2, and because the input end In is the low voltage level signal, the first transistor T1 and the third transistor T3 are activated, and the output end Out of the CMOS inverter outputs the second control signal LC2 of high voltage level, and then the voltage difference between the source and the drain of the second transistor T2 is zero, and the voltage difference between the source and the drain of the fourth transistor T4 is larger, which is equal to the absolute value of the voltage level difference of the first control signal LC1 and the second control signal LC2, i.e. only the fourth transistor T4 is in the high voltage stress state.

As the first control signal LC1 is high voltage level or the second control signal LC2 is low voltage level, the second output end A2 of the first selector 100 outputs the first control signal LC1, and the first output end B1 of the second selector 200 outputs the second control signal LC2. If the input end In of the CMOS inverter is inputted with the high voltage level signal, the first output end A1 of the first selector 100 outputs the second control signal LC2, and because the input end In is the high voltage level signal, the second transistor T2 and the fourth transistor T4 are activated, and the output end Out of the CMOS inverter outputs the second control signal LC2 of low voltage level, and then the voltage difference between the source and the drain of the first transistor T1 is zero, and the voltage difference between the source and the drain of the third transistor T3 is larger, which is equal to the absolute value of the voltage level difference of the first control signal LC1 and the second control signal LC2, i.e. only the third transistor T3 is in the high voltage stress state. If the input end In of the CMOS inverter is inputted with the low voltage level signal, the second output end A2 of the second selector 200 outputs the first control signal LC1, and because the input end In is the low voltage level signal, the first transistor T1 and the third transistor T3 are activated, and the output end Out of the CMOS inverter outputs the first control signal LC1 of high voltage level, and then the voltage difference between the source and the drain of the fourth transistor T4 is zero, and the voltage difference between the source and the drain of the second transistor T2 is larger, which is equal to the absolute value of the voltage level difference of the first control signal LC1 and the second control signal LC2, i.e. only the second transistor T2 is in the high voltage stress state.

Obviously, in the work procedure of the CMOS inverter, according to the voltage level high and low of the first, the second control signals, and the voltage level high and low of the inverter input end (In) signals, in the same duration, only one transistor in the first transistor T1, the second transistor T2, the third transistor T3 and the fourth transistor T4 is in the stress state, which relatively reduces the stress period of each transistor. By practicing the CMOS inverter in the embodiment of the present invention, the issue of the transistor lifetime decrease because the core transistor is in the high voltage state for a long period of time in the circuit that the inverter output voltage different is larger can be solved.

Figure 3:
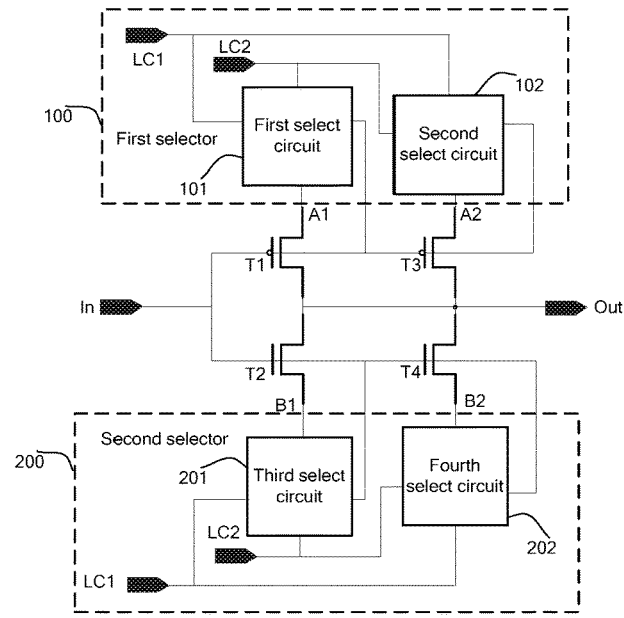
FIG. 3 is a circuit diagram of another CMOS inverter disclosed by the embodiment of the present invention.

Please refer to FIG. 3. FIG. 3 is a diagram of another CMOS inverter disclosed by the embodiment of the present invention.

As shown in FIG. 3, the CMOS inverter shown in this embodiment has the same circuit structure and the whole elements of the CMOS inverter shown in FIG. 2. Please refer to the description of the CMOS inverter shown in FIG. 2 in the aforesaid embodiment for detail. The repeated description is omitted here.

Furthermore, the difference is that in the CMOS inverter described in the embodiment shown in FIG. 3, the first selector 100 comprises a first select circuit 101 and a second select circuit 102, wherein: both the first select circuit 101 and the second select circuit 102 receives the first control signal LC1 and the second control signal LC2, and both the first select circuit 101 and the second select circuit 102 (i.e. the control ends C1 of the first selector 100 as aforementioned) are electrically coupled to the input end In of the CMOS inverter (i.e. the control end C1 of the first selector 100 is electrically coupled to the input end In of the CMOS inverter). The first select circuit 101 is electrically coupled to the source of the first transistor T1 (i.e. the first output end A1 of the first selector 100 is coupled to the source of the first transistor T1), and the second select circuit 102 is electrically coupled to the source of the third transistor T3 (i.e. the second output end A2 of the first selector 100 is coupled to the drain of the third transistor T3).

In diagram of the CMOS inverter shown in FIG. 3, as the second control signal LC2 is low voltage level or the input end In of the CMOS inverter is inputted with the high voltage level signal, the second selector 102 works, and the second output end A2 of the first selector 100 outputs the first control signal LC1. As the first control signal LC1 is low voltage level or the input end In of the CMOS inverter is inputted with the high voltage level signal, the first selector 101 works, and the first output end A1 of the first selector 100 outputs the second control signal LC2.

Furthermore, the second selector 200 comprises a third select circuit 201 and a fourth select circuit 202, wherein: both the third select circuit 201 and the fourth select circuit 202 receives the first control signal LC1 and the second control signal LC2, and both the third select circuit 201 and the fourth select circuit 202 (i.e. the control ends C2 of the second selector 200 as aforementioned) are electrically coupled to the input end In of the CMOS inverter (i.e. both the control ends C2 of the second selector 200 are electrically coupled to the input end In of the CMOS inverter). The third select circuit 201 is electrically coupled to the source of the second transistor T2 (i.e. the first output end B1 of the second selector 200 is coupled to the source of the second transistor T2), and the fourth select circuit 202 is electrically coupled to the source of the fourth transistor T4 (i.e. the second output end B2 of the second selector 200 is coupled to the source of the fourth transistor T4).

In diagram of the CMOS inverter shown in FIG. 3, as the first control signal LC1 is high voltage level or the input end In of the CMOS inverter is inputted with the low voltage level signal, the third selector 201 works, and the first output end B1 of the second selector 200 outputs the second control signal LC2; as the second control signal LC2 is high voltage level or the input end In of the CMOS inverter is inputted with the low voltage level signal, the fourth selector 202 works, and the second output end B2 of the second selector 200 outputs the first control signal LC1;

In diagram of the CMOS inverter shown in FIG. 3, under control of the first control signal LC1 and the second control signal LC2, one output end (the first output end A1 or the second output end A2) of the first selector 100 outputs the control signal of high voltage level, and one output end (the first output end B1 or the second output end B2) of the second selector 200 outputs the control signal of low voltage level; wherein the second output end A2 of the first selector 100 and the first output end B1 of the second selector 200 synchronously output the voltage levels which are inverse in phase, and the first output end A1 of the first selector 100 and the second output end B2 of the second selector 200 synchronously output the voltage levels which are inverse in phase. As the input end In of the CMOS inverter is inputted with the high voltage level signal, the other output end of the first selector 100 outputs low voltage level, and as the input end In of the CMOS inverter is inputted with the low voltage level signal, the other output end of the second selector 100 outputs high voltage level.

Figure 4:
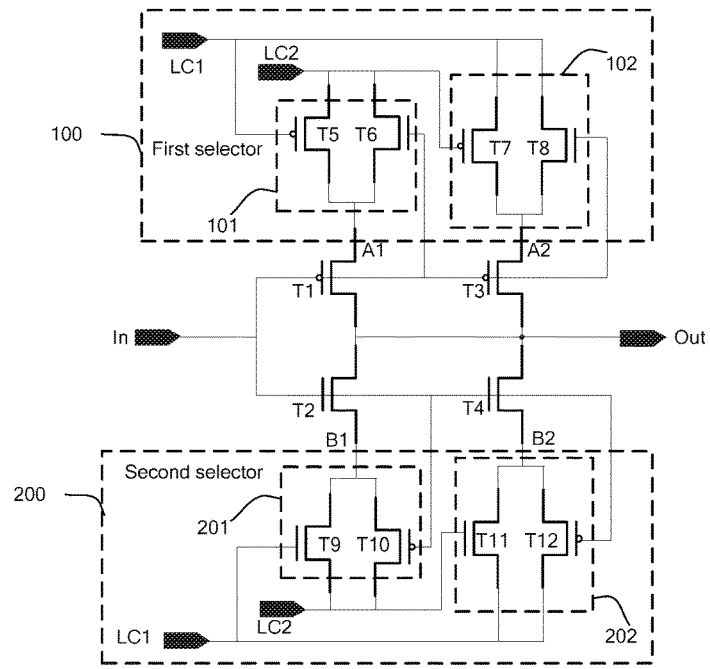
FIG. 4 is a circuit diagram of another CMOS inverter disclosed by the embodiment of the present invention.

Please refer to FIG. 4. FIG. 4 is a diagram of another CMOS inverter disclosed by the embodiment of the present invention. As shown in FIG. 3, the CMOS inverter shown in this embodiment has the same circuit structure and the whole elements of the CMOS inverter shown in FIG. 2 and FIG. 3. Please refer to the description of the CMOS inverter shown in FIG. 2 and FIG. 3 in the aforesaid embodiment for detail. The repeated description is omitted here.

Furthermore, the difference is that in the CMOS inverter described in the embodiment shown in FIG. 4, the first selector 101 comprises a fifth transistor T5 and a sixth transistor T6. A gate of the fifth transistor T5 receives the first control signal LC1, and a gate of the sixth transistor T6 is coupled to the input end In of the CMOS inverter (i.e. the gate of the sixth transistor T6 is coupled to the control end C1 of the first selector 100 as aforementioned), and both a source of the fifth transistor T5 and a drain of the sixth transistor T6 receives the second control signal LC2, and both a drain of the fifth transistor T5 and a source of the sixth transistor T6 are electrically coupled to the first output end A1 of the first selector 100.

The second selector 102 comprises a seventh transistor T7 and an eighth transistor T8. A gate of the seventh transistor T7 receives the second control signal LC2, and a gate of the eighth transistor T8 is coupled to the input end In (i.e. the gate of the eighth transistor T8 is coupled to the control end C1 of the first selector 100 as aforementioned, and also it can be understood as that the gates of the transistors T6 and T8 construct the control end C1 of the first selector 100) of the CMOS inverter, and both a source of the seventh transistor T7 and a drain of the eighth transistor T8 receives the first control signal LC1, and both a drain of the seventh transistor T7 and a source of the eighth transistor T8 are electrically coupled to the second output end A2 of the first selector 100.

The third select circuit 201 comprises a ninth transistor T9 and a tenth transistor T10. A gate of the ninth transistor T9 receives the first control signal LC1, and a gate of the tenth transistor T10 is coupled to the input end In (i.e. the gate of the tenth transistor T10 is coupled to the control end C2 of the second selector 200 as aforementioned) of the CMOS inverter, and both a source of the ninth transistor T9 and a drain of the tenth transistor T10 receives the second control signal LC2, and both a drain of the ninth transistor T9 and a source of the tenth transistor T10 are electrically coupled to the first output end B1 of the second selector 200.

The fourth select circuit 202 comprises an eleventh transistor T11 and a twelfth transistor T12, wherein: a gate of the eleventh transistor T11 receives the second control signal LC2, and a gate of the twelfth transistor T12 is coupled to the input end In (i.e. the gate of the twelfth transistor T12 is coupled to the control end C2 of the second selector 200 as aforementioned, and also it can be understood as that the gates of the transistors T10 and T12 construct the control end C2 of the second selector 200) of the CMOS inverter, and both a source of the eleventh transistor T11 and a drain of the twelfth transistor T12 receives the first control signal LC1, and both a drain of the eleventh transistor T11 and a source of the twelfth transistor T12 are electrically coupled to the second output end B2 of the second selector 200.

Figure 5:
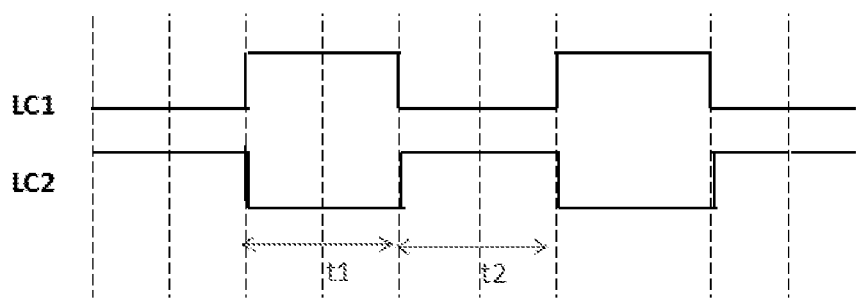
FIG. 5 is a sequence diagram of two control signal in the CMOS inverter according to the embodiment of the present invention.

In the embodiment of the present invention, the first control signal LC1 and the second control signal LC2 are inverse in phase. Supposing that the high voltage level of the two control signals is 30V, and the low voltage level is −6V. The waveform sequence diagram of the two control signals is shown in FIG. 5. The work condition of the CMOS inverter is explained one by one according to the two periods t1, t2 shown in FIG. 5:

During the period t1 in the waveform sequence diagram shown in FIG. 5, the first control signal LC1 is high voltage level, and the second control signal LC2 is low voltage level, and the stress voltages of the four core transistors of the CMOS inverter are shown in the following table 1:

| Transistor label | stress voltage/V | |
| --- | --- | --- |
| | As In is inputted with high voltage level | As In is inputted with low voltage level |
| T1 | 0 | 0 |
| T3 | 36 | 0 |
| T2 | 0 | 36 |
| T4 | 0 | 0 |

The specific analysis procedure is: in the period t1, the first control signal LC1 is high voltage level, and the second control signal is low voltage level, and the seventh transistor T7 and the ninth transistor T9 are activated, and the second output end A2 of the first selector 100 outputs the first control signal LC1 of high voltage level, and the first output end B1 of the second selector 200 outputs the second control signal LC2, and in the period t1, if the input end In of the CMOS inverter is inputted with the high voltage level signal, the sixth transistor T6 and the eighth transistor T8 in the first selector 100 are activated, and the first output end A1 of the first selector 100 outputs the second control signal LC2 of low voltage level, and then the input end In of the first selector 100 also activates the second transistor T2 and the fourth transistor T4, i.e. the voltage difference between the sources and the drains of the second transistor T2 and the fourth transistor T4 are zero. The output end Out of the CMOS inverter outputs the second control signal LC2 of low voltage level, and then, both the voltages of the source and the drain of the first transistor T1 are LC2, i.e. the voltage difference between the source and the drain of the first transistor T1 is zero, and the voltage difference between the source and the drain of the third transistor T3 is larger, which is equal to the absolute value 36V of the voltage level difference of the first control signal LC1 and the second control signal LC2, i.e. only the third transistor T3 is in the high voltage stress state.

In the period t1, if the input end In of the CMOS inverter is inputted with the low voltage level signal, the tenth transistor T10 and the twelfth transistor T12 in the second selector 200 are activated, and the second output end B2 of the second selector 200 outputs the first control signal LC1 of low voltage level, and then, the input end In also activates the first transistor T1 and the third transistor T3, i.e. both the voltage differences between the sources and the drains of the first transistor T1 and the third transistor T3 are zero. The output end Out of the CMOS inverter outputs the first control signal LC1 of high voltage level, and then, the voltage between the source and the drain of the fourth transistor T4 is LC1, i.e. the voltage difference between the source and the drain of the fourth transistor T4 is zero, and the voltage difference between the source and the drain of the second transistor T2 is larger, which is equal to the absolute value of the voltage level difference 36V of the first control signal LC1 and the second control signal LC2, i.e. only the second transistor T2 is in the high voltage stress state.

From the above analysis, the first control signal LC1 is high voltage level, and along with the change of the high, low voltage level signals of the input end In of the CMOS inverter, the second transistor T2 and the third transistor T3 take turns to be in the high voltage stress state.

During the period t2 in the waveform sequence diagram shown in FIG. 5, the first control signal LC1 is low voltage level, and the second control signal LC2 is high voltage level, and the specific analysis procedure of the stress voltages of the four core transistors of the CMOS inverter is similar with the table 1. No detail analysis is conducted here. The specific result is shown in the following table 2:

| Transistor label | stress voltage/V | |
|---|---|---|
| | As In is inputted with high voltage level | As In is inputted with low voltage level |
| T1 | 36 | 0 |
| T3 | 0 | 0 |
| T2 | 0 | 0 |
| T4 | 0 | 36 |

Similarly, as the second control signal LC2 is high voltage level, and along with the change of the high, low voltage level signals of the input end In of the CMOS inverter, the first transistor T1 and the fourth transistor T4 take turns to be in the high voltage stress state.

In the CMOS inverter shown in FIG. 4, according to the voltage level high and low of the first control signal LC1 and the second control signal LC2, and the voltage level high and low of the inverter input end (In) signals, in the same duration, only one transistor in the first transistor T1, the second transistor T2, the third transistor T3 and the fourth transistor T4 is in the stress state, which relatively reduces the stress period of each transistor. By practicing the CMOS inverter in the embodiment of the present invention, the issue of the transistor lifetime decrease because the core transistor is in the high voltage state for a long period of time in the inverter according to prior art can be solved.

Preferably, high voltage level duty ratio durations and low voltage level duty ratio durations of the first control signal LC1 and the second control signal LC2 in one cycle are equal. Namely, the duty ratios of the high voltage level and the low voltage level of the first control signal LC1 and the second control signal LC2 are equal. Thus, the durations that the first transistor T1, the second transistor T2, the third transistor T3 and the fourth transistor T4 are in the stress state are almost the same, and the losses of the respective transistors are the same.

Preferably, the fifth transistor T5, the seventh transistor T7, the tenth transistor T10 and the twelfth transistor T12 are PMOS transistors, and the sixth transistor T6, the eighth transistor T8, the ninth transistor T9 and the eleventh transistor T11 are NMOS transistors.

Selectably, it is also an option that the types of the transistors and the received control signals in FIG. 4 can be amended correspondingly to achieve the result of the embodiment of the present invention. The repeated description is omitted here.

The embodiment of the present invention further provides an electronic device using the CMOS inverter shown in the aforesaid FIG. 2 to FIG. 4. The CMOS inverter in the embodiment of the present invention can be applied to any electronic devices which require the inverter, and more particularly applied to the case that the voltage difference change of the inverter output end is larger, which the voltage level difference of the first control signal LC1 and the second control signal LC2. For instance, the CMOS inverter in the embodiment of the present invention can be applied in the CMOS GOA circuit, which can promote the stability of the GOA circuit.

In the description of the present specification, the reference terms, "one embodiment", "some embodiments", "an illustrative embodiment", "an example", "a specific example", or "some examples" mean that such description combined with the specific features of the described embodiments or examples, structure, material, or characteristic is included in the utility model of at least one embodiment or example. In the present specification, the terms of the above schematic representation do not certainly refer to the same embodiment or example. Meanwhile, the particular features, structures, materials, or characteristics which are described may be combined in a suitable manner in any one or more embodiments or examples.

The detail description has been introduced above for the CMOS inverter and the application provided by the embodiment of the invention. Herein, a specific case is applied in this article for explain the principles and specific embodiments of the present invention have been set forth. The description of the aforesaid embodiments is only used to help understand the method of the present invention and the core idea thereof; meanwhile, for those of ordinary skill in the art, according to the idea of the present invention, there should be changes either in the specific embodiments and applications but in sum, the contents of the specification should not be limitation to the present invention.

What is claimed is:

1. A Complementary Metal Oxide Semiconductor (CMOS) inverter, wherein the CMOS inverter comprises a first selector, a second selector, a first transistor, a second transistor, a third transistor and a fourth transistor, wherein:

all gates of the first transistor, the second transistor, the third transistor and the fourth transistor are coupled to an input end of the CMOS inverter, and all drains of the first transistor, the second transistor, the third transistor and the fourth transistor are coupled to an output end of the CMOS inverter, and a source of the first transistor is coupled to a first output end of the first selector, and a source of the third transistor is coupled to a second output end of the first selector, and a source of the second transistor is coupled to a first output end of the second selector, and a source of the fourth transistor is coupled to a second output end of the second selector;

both the first selector and the second selector receive a first control signal and a second control signal, and the first control signal and the second control signal are inverse in phase, and both the first selector and the second selector are electrically coupled to an input end of the CMOS inverter;

as the second control signal is high voltage level or the input end of the CMOS inverter is inputted with a high voltage level signal, the first output end of the first selector outputs the second control signal; as the first control signal is high voltage level or the input end of the CMOS inverter is inputted with the high voltage level signal, the second output end of the first selector outputs the first control signal; as the first control signal is low voltage level or the input end of the CMOS inverter is inputted with a low voltage level signal, the second output end of the second selector outputs the first control signal; as the second control signal is low voltage level or the input end of the CMOS inverter is inputted with the low voltage level signal, the first output end of the second selector outputs the second control signal.

2. The CMOS inverter according to claim 1, wherein the first selector comprises a first select circuit and a second select circuit, wherein:
both the first select circuit and the second select circuit receives the first control signal and the second control signal, and both the first select circuit and the second select circuit are electrically coupled to the input end of the CMOS inverter, and the first select circuit is electrically coupled to the source of the first transistor, and the second select circuit is electrically coupled to the source of the third transistor.

3. The CMOS inverter according to claim 2, wherein the first select circuit comprises a fifth transistor and a sixth transistor, wherein:
a gate of the fifth transistor receives the first control signal, and a gate of the sixth transistor is coupled to the input end of the CMOS inverter, and both a source of the fifth transistor and a drain of the sixth transistor receives the second control signal, and both a drain of the fifth transistor and a source of the sixth transistor are electrically coupled to the first output end of the first selector.

4. The CMOS inverter according to claim 2, wherein the second select circuit comprises a seventh transistor and an eighth transistor, wherein:
a gate of the seventh transistor receives the second control signal, and a gate of the eighth transistor is coupled to the input end of the CMOS inverter, and both a source of the seventh transistor and a drain of the eighth transistor receives the first control signal, and both a drain of the seventh transistor and a source of the eighth transistor are electrically coupled to the second output end of the first selector.

5. The CMOS inverter according to claim 2, wherein high voltage level duty ratio durations and low voltage level duty ratio durations of the first control signal and the second control signal in one cycle are equal.

6. The CMOS inverter according to claim 1, wherein the second selector comprises a third select circuit and a fourth select circuit, wherein:
both the third select circuit and the fourth select circuit receives the first control signal and the second control signal, and both the third select circuit and the fourth select circuit are electrically coupled to the input end of the CMOS inverter, and the third select circuit is electrically coupled to the source of the second transistor, and the fourth select circuit is electrically coupled to the source of the fourth transistor.

7. The CMOS inverter according to claim 6, wherein the third select circuit comprises a ninth transistor and a tenth transistor, wherein:

a gate of the ninth transistor receives the first control signal, and a gate of the tenth transistor is coupled to the input end of the CMOS inverter, and both a source of the ninth transistor and a drain of the tenth transistor receives the second control signal, and both a drain of the ninth transistor and a source of the tenth transistor are electrically coupled to the first output end of the second selector.

8. The CMOS inverter according to claim 6, wherein the fourth select circuit comprises an eleventh transistor and a twelfth transistor, wherein:
a gate of the eleventh transistor receives the second control signal, and a gate of the twelfth transistor is coupled to the input end of the CMOS inverter, and both a source of the eleventh transistor and a drain of the twelfth transistor receives the first control signal, and both a drain of the eleventh transistor and a source of the twelfth transistor are electrically coupled to the second output end of the second selector.

9. The CMOS inverter according to claim 6, wherein high voltage level duty ratio durations and low voltage level duty ratio durations of the first control signal and the second control signal in one cycle are equal.

10. The CMOS inverter according to claim 1, wherein both the first transistor and the third transistor are PMOS (P-channel Metal Oxide Semiconductor) transistors, and both the second transistor and the fourth transistor are NMOS (N-channel Metal Oxide Semiconductor) transistors.

11. The CMOS inverter according to claim 1, wherein high voltage level duty ratio durations and low voltage level duty ratio durations of the first control signal and the second control signal in one cycle are equal.

12. An electronic device, wherein the electronic device comprises a Complementary Metal Oxide Semiconductor (CMOS) inverter, wherein the CMOS inverter comprises a first selector, a second selector, a first transistor, a second transistor, a third transistor and a fourth transistor, wherein:
all gates of the first transistor, the second transistor, the third transistor and the fourth transistor are coupled to an input end of the CMOS inverter, and all drains of the first transistor, the second transistor, the third transistor and the fourth transistor are coupled to an output end of the CMOS inverter, and a source of the first transistor is coupled to a first output end of the first selector, and a source of the third transistor is coupled to a second output end of the first selector, and a source of the second transistor is coupled to a first output end of the second selector, and a source of the fourth transistor is coupled to a second output end of the second selector;
both the first selector and the second selector receive a first control signal and a second control signal, and the first control signal and the second control signal are inverse in phase, and both the first selector and the second selector are electrically coupled to an input end of the CMOS inverter;
as the second control signal is high voltage level or the input end of the CMOS inverter is inputted with a high voltage level signal, the first output end of the first selector outputs the second control signal; as the first control signal is high voltage level or the input end of the CMOS inverter is inputted with the high voltage level signal, the second output end of the first selector outputs the first control signal; as the first control signal is low voltage level or the input end of the CMOS inverter is inputted with a low voltage level signal, the second output end of the second selector outputs the first control signal; as the second control signal is low voltage level or the input end of the CMOS inverter is inputted with the low voltage level signal, the first output end of the second selector outputs the second control signal.

13. The electronic device according to claim 12, wherein the first selector comprises a first select circuit and a second select circuit, wherein:
both the first select circuit and the second select circuit receives the first control signal and the second control signal, and both the first select circuit and the second select circuit are electrically coupled to the input end of the CMOS inverter, and the first select circuit is electrically coupled to the source of the first transistor, and the second select circuit is electrically coupled to the source of the third transistor.

14. The electronic device according to claim 13, wherein the first select circuit comprises a fifth transistor and a sixth transistor, wherein:
a gate of the fifth transistor receives the first control signal, and a gate of the sixth transistor is coupled to the input end of the CMOS inverter, and both a source of the fifth transistor and a drain of the sixth transistor receives the second control signal, and both a drain of the fifth transistor and a source of the sixth transistor are electrically coupled to the first output end of the first selector.

15. The electronic device according to claim 13, wherein the second select circuit comprises a seventh transistor and an eighth transistor, wherein:
a gate of the seventh transistor receives the second control signal, and a gate of the eighth transistor is coupled to the input end of the CMOS inverter, and both a source of the seventh transistor and a drain of the eighth transistor receives the first control signal, and both a drain of the seventh transistor and a source of the eighth transistor are electrically coupled to the second output end of the first selector.

16. The electronic device according to claim 12, wherein the second selector comprises a third select circuit and a fourth select circuit, wherein:
both the third select circuit and the fourth select circuit receives the first control signal and the second control signal, and both the third select circuit and the fourth select circuit are electrically coupled to the input end of the CMOS inverter, and the third select circuit is electrically coupled to the source of the second transistor, and the fourth select circuit is electrically coupled to the source of the fourth transistor.

17. The electronic device according to claim 16, wherein the third select circuit comprises a ninth transistor and a tenth transistor, wherein:
a gate of the ninth transistor receives the first control signal, and a gate of the tenth transistor is coupled to the input end of the CMOS inverter, and both a source of the ninth transistor and a drain of the tenth transistor receives the second control signal, and both a drain of the ninth transistor and a source of the tenth transistor are electrically coupled to the first output end of the second selector.

18. The electronic device according to claim 16, wherein the fourth select circuit comprises an eleventh transistor and a twelfth transistor, wherein:
a gate of the eleventh transistor receives the second control signal, and a gate of the twelfth transistor is coupled to the input end of the CMOS inverter, and both a source of the eleventh transistor and a drain of the twelfth transistor receives the first control signal, and both a drain of the eleventh transistor and a source of the twelfth transistor are electrically coupled to the second output end of the second selector.

19. The electronic device according to claim 12, wherein both the first transistor and the third transistor are PMOS (P-channel Metal Oxide Semiconductor) transistors, and both the second transistor and the fourth transistor are NMOS (N-channel Metal Oxide Semiconductor) transistors.

20. The electronic device according to claim 12, wherein high voltage level duty ratio durations and low voltage level duty ratio durations of the first control signal and the second control signal in one cycle are equal.

* * * * *